US012703038B2

(12) United States Patent
Koestler et al.

(10) Patent No.: US 12,703,038 B2
(45) Date of Patent: Aug. 11, 2026

(54) WELDING GUN AND METHOD FOR MONITORING A WELDING PROCESS

(71) Applicant: NEWFREY LLC, New Britain, CT (US)

(72) Inventors: Andreas Koestler, Giessen (DE); Manuel Spiess, Giessen (DE); Kai-Marius Weber, Giessen (DE)

(73) Assignee: Newfrey LLC, New Britain, CT (US)

( * ) Notice: Subject to any disclaimer, the term of this patent is extended or adjusted under 35 U.S.C. 154(b) by 946 days.

(21) Appl. No.: 17/654,680

(22) Filed: Mar. 14, 2022

(65) Prior Publication Data

US 2022/0297217 A1 Sep. 22, 2022

(30) Foreign Application Priority Data

Mar. 16, 2021 (EP) .................................... 21162805

(51) Int. Cl.

| | |
|---|---|
| ***B23K 9/095*** | (2006.01) |
| ***B23K 37/02*** | (2006.01) |
| ***G01C 19/5783*** | (2012.01) |
| ***G01R 33/02*** | (2006.01) |

(52) U.S. Cl.

CPC ........ *B23K 9/0956* (2013.01); *B23K 37/0205* (2013.01); *G01C 19/5783* (2013.01); *G01R 33/02* (2013.01)

(58) Field of Classification Search

CPC .. B23K 9/0956; B23K 37/0205; B23K 9/095; B23K 9/202; G01C 19/5783; G01R 33/02

See application file for complete search history.

(56) References Cited

U.S. PATENT DOCUMENTS

| | | | |
|---|---|---|---|
| 4,456,808 | A | 6/1984 | Wilkinson et al. |
| 5,252,802 | A | 10/1993 | Raycher |
| 5,406,044 | A | 4/1995 | Killian et al. |
| 5,662,820 | A | 9/1997 | Schwiete et al. |
| 5,938,945 | A | 8/1999 | Hofmann et al. |
| 6,723,945 | B2 | 4/2004 | Kurz |
| 6,750,417 | B2 | 6/2004 | Madsak et al. |
| 7,223,934 | B2 | 5/2007 | Bernhard et al. |

(Continued)

FOREIGN PATENT DOCUMENTS

| | | | |
|---|---|---|---|
| CA | 2958203 | A1 | 4/2016 |
| CN | 103762822 | A | 1/2014 |

(Continued)

OTHER PUBLICATIONS

Machine Translation of Schwiete (DE 4314528) preformed on Dec. 2, 2025 (Year: 1994).*

(Continued)

*Primary Examiner* — Brian W Jennison

(74) *Attorney, Agent, or Firm* — Harness, Dickey & Pierce, P.L.C.

(57) ABSTRACT

Method for monitoring the behaviour of a welding gun and handheld welding gun for welding an element to a component comprising a sensor unit adapted to measure different parameters during the welding process, a processing system with a control card adapted to control one or more parameters of the welding process, wherein the sensor unit comprises a gyroscope sensor mounted within the housing, wherein the gyroscope sensor is arranged on the control card.

14 Claims, 5 Drawing Sheets

(56) References Cited

U.S. PATENT DOCUMENTS

| | | | | |
|---|---|---|---|---|
| 8,274,013 | B2 | 9/2012 | Wallace | |
| 9,744,615 | B2 | 8/2017 | Jones et al. | |
| 9,975,196 | B2 | 5/2018 | Zhang et al. | |
| 10,335,883 | B2 | 7/2019 | Albrecht et al. | |
| 11,623,293 | B2 | 4/2023 | Bertsch et al. | |
| 2003/0132202 | A1 | 7/2003 | Madsak et al. | |
| 2004/0149695 | A1 | 8/2004 | Madsak et al. | |
| 2005/0056620 | A1 | 3/2005 | Broehl | |
| 2007/0267392 | A1 | 11/2007 | Lame | |
| 2013/0015163 | A1* | 1/2013 | Jones | B23K 9/206 219/98 |
| 2013/0068743 | A1 | 3/2013 | Delin et al. | |
| 2013/0291271 | A1* | 11/2013 | Becker | G06F 3/012 2/8.2 |
| 2016/0125653 | A1 | 5/2016 | Denis | |
| 2016/0153767 | A1* | 6/2016 | Ihlenfeldt | G01B 5/008 33/503 |
| 2016/0214198 | A1 | 7/2016 | Hsu | |
| 2016/0215653 | A1* | 7/2016 | DaCunha | F01D 5/06 |
| 2019/0030696 | A1 | 1/2019 | Seith et al. | |
| 2020/0246905 | A1 | 8/2020 | Bertsch et al. | |
| 2020/0261998 | A1 | 8/2020 | Bertsch et al. | |
| 2021/0187650 | A1 | 6/2021 | Bertsch et al. | |
| 2023/0011718 | A1 | 1/2023 | Starzengruber et al. | |

FOREIGN PATENT DOCUMENTS

| | | | | |
|---|---|---|---|---|
| CN | 111163893 | A | 5/2020 | |
| DE | 4314528 | A1 * | 11/1994 | B23K 9/202 |
| DE | 29507195 | U1 | 6/1995 | |
| DE | 19530416 | A1 | 2/1996 | |
| DE | 10059659 | A1 | 6/2002 | |
| DE | 102011053799 | A1 | 3/2013 | |
| DE | 102016206036 | A | 10/2017 | |
| DE | 102018208872 | A1 | 12/2019 | |
| EP | 1432544 | A1 | 6/2004 | |
| EP | 3243040 | A2 | 11/2017 | |
| EP | 3466582 | A1 | 4/2019 | |
| EP | 3466587 | A1 | 4/2019 | |
| EP | 3691825 | A1 | 8/2020 | |
| EP | 3177423 | B1 | 10/2020 | |
| EP | 3964318 | A1 | 3/2022 | |
| JP | S63165077 | A | 7/1988 | |
| JP | H06573 | A | 1/1994 | |
| JP | 2000158149 | A | 6/2000 | |
| JP | 2001143778 | A | 5/2001 | |
| JP | 2004291021 | A | 10/2004 | |
| JP | 2006320950 | A | 11/2006 | |
| JP | 2009290991 | A | 12/2009 | |
| JP | 2012509206 | A | 4/2012 | |
| JP | 2012240092 | A | 12/2012 | |
| JP | 2013067000 | A | 4/2013 | |
| JP | 2013245938 | A | 12/2013 | |
| JP | 2014224590 | A | 12/2014 | |
| JP | 2015066635 | A | 4/2015 | |
| JP | 6219595 | B2 | 10/2017 | |
| JP | 2018126762 | A | 8/2018 | |
| JP | 2020535972 | A | 12/2020 | |
| KR | 20210047447 | A | 4/2021 | |
| WO | 17202865 | A1 | 11/2017 | |

OTHER PUBLICATIONS

European Search Report Dated Aug. 16, 2021 cited in corresponding European Application No. 21162805.2.

Office Action mailed Oct. 6, 2025, in corresponding Japanese Application No. 2022-041681.

Extended European Search Report dated Nov. 21, 2025 cited in corresponding European Application No. 25195549.8.

First Office Action mailed Feb. 3, 2026 in Chinese Application No. 202210243218.4.

First Office Action mailed Feb. 5, 2026 in Chinese Application No. 202210243299.8.

Office Action mailed Apr. 30, 2026 in Japanese Application No. 2022-041680.

* cited by examiner

WELDING GUN AND METHOD FOR MONITORING A WELDING PROCESS

CROSS-REFERENCE TO RELATED APPLICATIONS

This application claims priority from European Patent Application No. 21162805.2, filed Mar. 16, 2021, the disclosures of which are incorporated herein by reference in their entirety.

BACKGROUND OF THE INVENTION

The present invention relates to a welding gun, and notably to a handheld welding gun for welding an element to a component. More particularly, the present invention relates to a hand welding device for short-time arc welding of elements, such as metal studs, to parts, such as metal sheets.

Welding is a process that has become ubiquitous in various industries for a variety of types of applications. For example, welding is often performed in applications such as shipbuilding, aircraft repair, construction, and so forth. While these welding operations may be automated in certain contexts, there still exists a need for manual welding operations.

In short-time arc welding (also known as stud welding) elements such as metal studs are welded onto metal parts such as metal sheets. The studs serve as anchors for various fastening purposes. Accordingly, the studs may be configured as threaded studs (with metric thread), as coarse-threaded studs, pine tree studs, T-studs, etc. In the automotive industry, stud welding has been much used for some years. Here the stud welding technology serves to fasten body parts, to lay electric leads, to fasten carpeting, to weld bolts to car body panels, wherein fixing clips made of plastic are fixed to connect to the bolts, to which fixing clips cables, wires etc. are fixed, etc. A stroke ignition process may especially be used. A metal stud is first placed in the location on the metal sheet where it is to be welded on. Then a so-called pilot current is switched on and the metal stud is lifted somewhat relative to the metal sheet. Thus, an electric arc is set. Then the welding current proper is switched on and the mutually opposed faces are incipiently fused by the high-energy electric arc. Then the metal stud is again lowered onto the metal sheet so that the respective melts will mingle. The arc is short-circuited. The combined melt solidifies, and the welding operation is complete.

EP1432544A1 from the applicant discloses a known handheld welding gun including an element holder, an electromagnetic actuator operably advancing the holder, and a pneumatic element feeding hose.

In some manual welding operations, it may be desirable to monitor weld parameters throughout the welding operation and/or welding gun use before or after the welding operation. While, in automated welding process, the weld parameters may be robotically controlled, parameters like gun motion, damages, . . . in a welding operation with a handheld welding gun the welding parameters may depend on the operator's welding technique, the weld pattern and position, the experience of the welding operator, and so forth. Unfortunately, it may be difficult to measure this weld motion during a welding operation due to features of the welding environment, operator considerations, and so forth.

It is well-known to use sensors in a welding apparatus in order to monitor weld parameters. U.S. Pat. No. 9,975,196 for instance discloses an inertial measurement unit affixed to an apparatus. The inertial measurement unit is endowed with a tri-axis gyro and a tri-axis accelerometer. U.S. Ser. No. 10/335,883 is directed to a gravity-based weld travel speed sensing system. An orientation sensor is associated with a welding torch and configured to sense a welding torch orientation relative to a direction of gravity. EP3177423 A1 relates to a welding system comprising position detection systems with a controller configured to determine welding parameters during the welding session based on the outputs of the detection systems. In EP3243040, a system for measuring the orientation of a welding torch for a manual arc welding process is disclosed.

BRIEF SUMMARY OF THE INVENTION

It is an object of the present disclosure to specify an improved handheld welding gun adapted to monitor a welding operation but also a welding gun use and behaviour before and after the welding operation.

Accordingly, the present disclosure is directed to a handheld welding gun for welding an element to a component comprising: a housing with a main portion and a grip with a trigger, the grip extending from the main portion, a holding unit mounted on the main portion and adapted to movably hold one element between a lift position and a plunge position, a linear actuator adapted to actuate the holding unit in order to move the element between the lift position and the plunge position, a nozzle surrounding the holding unit adapted to contact the component, a welding current contact element arranged in the housing and adapted to direct a welding current to the element, a sensor unit adapted to measure different parameters during the welding process, a processing system with a control card adapted to control one or more parameters of the welding process, wherein the sensor unit comprises a gyroscope sensor mounted within the housing, wherein the gyroscope sensor is arranged on the control card.

The use of a gyroscope sensor in the sensor unit for a handheld welding gun adapted for an arc-lifting process (with a holding unit mounted inside the gun for movable holding a fastener between a lift position and a plunge position) allows a strict control of the position and behaviour of the gun before, during and after the welding process. By mounting the gyroscope sensor directly on a control card, a compact device is realized. Such device is adapted to different environments.

In an embodiment, the sensor unit further comprise an accelerometer and a magnetometer mounted within the housing. The data provided by the accelerometer and/or the magnetometer are additional parameters from those provided by the gyroscope sensor and allow a better evaluation of the environment and the behavior of the welding gun. For instance, the accelerometer can be integrated with the gyroscope sensor.

In an embodiment, a second accelerometer, with a measurement width different than the first accelerometer may be provided. The second accelerometer may be provided in the vicinity of the first accelerometer and arranged on the control card or may be arranged in a different area of the welding gun. In an embodiment, the accelerometer and the magnetometer communicate with the processing system and are arranged on the control card. A compact system is thus provided.

In an embodiment, the magnetometer is detecting the magnetic field of the linear actuator. The linear motor is a voice call motor. Through the change of magnetic field, it is possible to see the movement of the motor.

In an embodiment, the gyroscope sensor and/or the accelerometer and/or the magnetometer are M EMS sensors. This allows a compact sensor unit, easy to install and to implement.

In an embodiment, the gyroscope sensor and/or the accelerometer and/or the magnetometer are mounted in the grip of the housing.

In an embodiment, the gyroscope sensor and/or the accelerometer and/or the magnetometer are mounted in the main portion of the housing.

In an embodiment, the motion and/or the position of the welding gun is detected by the gyroscope sensor and/or the accelerometer and/or the magnetometer and the controller is configured to adapt the welding parameters depending on the position or motion of the welding gun.

In an embodiment, the main portion and the holding unit longitudinally extend along a longitudinal axis X corresponding to a welding axis, wherein the grip extends longitudinally along an axis sensibly orthogonal to the longitudinal axis X, and wherein the gyroscope sensor continuously senses the orientation of the welding gun.

The present disclosure is also directed to a method for monitoring the behavior of a welding gun, comprising the step of determining and recording the orientation of the handheld welding gun by the gyroscope sensor.

In an embodiment, the method further comprises the step of detecting a particular welding program from a library comprising a plurality of predetermined welding program with the orientation of the welding gun.

In an embodiment, the method further comprises the step of determining a faulty operation from the orientation of the welding gun.

In an embodiment, the selection of welding parameters depends on the parameters recorded through the gyroscope sensor.

In an embodiment, the method comprises the step of counting the number of weld spots by using the data provided by the gyroscope sensor or the sensor unit. This counting function allows to ensure that the welding cycle is completed, and no spot has been disregarded. Besides, for each weld spot a particular orientation or position of the welding gun may be necessary. The sensor unit can confirm that the element have been welded at the correct spots with correct pre-determined weld parameters.

The present disclosure also relates to a method for monitoring a welding process with a welding gun as disclosed above, comprising the step of recording the acceleration of the welding gun along a welding axis during the welding process and recording the strength of the magnetic field along the welding axis, in order to detect an early removal of the welding gun from the workpiece.

It is also another object of the present disclosure to provide a compact handheld welding gun easily operated by a user. The known welding guns comprise several sensors or measurement system in order to improve the welding process. Displacement measurement systems are often arranged in welding guns, as notably disclosed in DE102016108612. However, implementing such systems often leads to cumbersome welding guns, which are not easy to handle. This is therefore also an object of the present disclosure to provide a compact welding gun with very low tolerances for the measuring system.

Accordingly, the present invention provides, a handheld welding gun for welding an element to a component comprising: a housing with a main portion and a grip with a trigger, the grip extending from the main portion, a holding unit mounted on the main portion and adapted to movably hold one element between a lift position and a plunge position, a linear actuator with a linear actuator housing and a linear actuator rod adapted to actuate the holding unit in order to move the element between the lift position and the plunge position, the linear actuator rod extending partly inside and partly outside the linear actuator housing, a nozzle surrounding the holding unit adapted to contact the component, a welding current contact element arranged in the housing and adapted to direct a welding current to the element, a sensor unit adapted to measure different parameters during the welding process, a processing system with a control card adapted to control one or more parameters of the welding process, a displacement measuring system communicating with the control card, characterized in that that the linear actuator, the displacement measuring system and the control card are connected together to form a compact actuator unit, and in that the actuator unit is mounted in the main portion at the opposite of the holding unit.

Connecting the control card, the displacement measuring system and the actuator together allows a compact unit, easily mounted within the housing. No further control card is necessary, the displacement measurement system is accurate with low tolerances and the processing system adapted to process the data of a sensor unit or the displacement measuring system is mounted within the housing, which reduces the number of extra-units necessary (no legacy boxes anymore). An external processor which controls the welding process per se is arranged outside of the welding box. The external processor communicates with the processing system.

In an embodiment, the displacement measuring system is an optical measuring system and comprises an encoder arranged on the control card and an encoder strip. Such system is easily implemented and light weighted.

In an embodiment, the encoder strip is fixed to the linear actuator rod through a strip holder and is slidingly movable with regard to the encoder.

In an embodiment, the encoder is encapsulated. This limits the risk of soiling and reduce the maintenance needs.

In an embodiment, the control card is attached to the linear actuator. This form a compact unit easily mounted within the housing.

In an embodiment, the linear actuator rod is movable along a longitudinal axis with regard to the linear actuator housing and is secured against rotation around said longitudinal axis. The rod moves the element between the lift and plunge positions. Securing the rod against rotation allows a precise movement of the rod between the positions with regard to the workpiece or the component.

In an embodiment, the linear actuator rod is secured against rotation around said longitudinal axis by the linear actuator housing. No additional element is necessary to secure the rod against rotation.

In an embodiment, the linear actuator rod has a non-circular cross-section shape.

In an embodiment, the linear actuator rod has an oblong cross-section shape.

In an embodiment, the movable parts of the linear actuator are guided within the linear actuator housing by a bearing, for example a sintered bronze bearing.

In an embodiment, a coil body is arranged within the linear actuator housing, and wherein two bearings are arranged between the coil body and the linear actuator housing, and wherein the first bearing is arranged at a first end of the coil body, and the second bearing is arranged at a second end of the coil body.

In an embodiment, the bearings are in direct contact with the coil body. Thus, a smoother guiding is enabled and no additional parts are needed.

BRIEF DESCRIPTION OF THE DRAWINGS

A specific embodiment of the present invention will now be described, by way of example only and with reference to the accompanying drawings, of which.

DETAILED DESCRIPTION OF THE PREFERRED EMBODIMENTS

Figure 1:
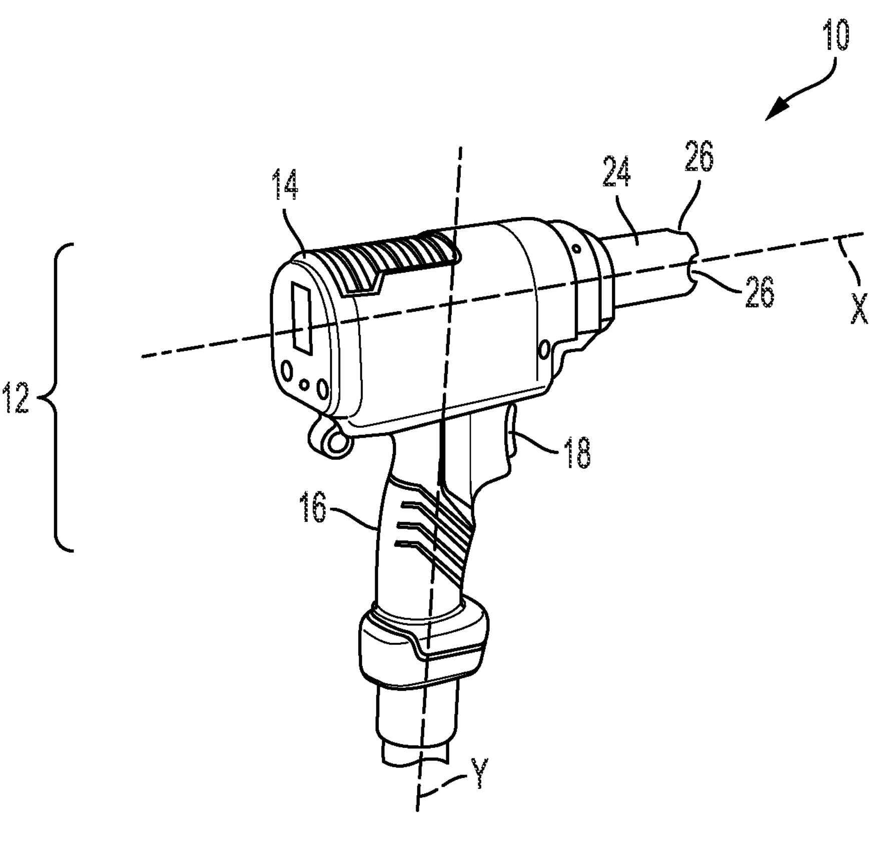
FIG. 1 shows a perspective view of a handheld welding gun with a housing having a main portion and a grip having a trigger according to the invention.

Corresponding reference numerals indicate corresponding parts throughout the several views of the drawings.

FIG. 1 shows a handheld welding gun 10 for welding an element 22 to a component or workpiece. The welding gun 10 comprises a housing 12. The housing 12 is provided with a main portion 14 and a grip 16. The grip 16 is adapted to be held by a user and comprises a trigger 18. The grip 16 extends from the main portion 14, and notably orthogonally extends from the main portion. More particularly, the main portion 14 longitudinally extends along a longitudinal axis X, and the grip portion longitudinally extends along a grip axis Y, the grip axis Y being sensibly perpendicular to the longitudinal axis X.

As shown in FIG. 1, a holding unit 20 is mounted on the main portion 14. The holding unit 20 is adapted to hold an element 22, for instance a fastener or a stud at a time. The element or fastener is secured to the holding unit 20 and then the holding unit moves the element between a lift position and a plunge position. The holding unit comprises a stud holder adapted to clamp the anchor portion of a stud, the flange portion (destined to be welded to a surface) remaining at a free end of the stud holders. Such stud holders are well known and will not be detailed further.

A welding current contact element is arranged in the housing 12. The welding contact element is adapted to direct a welding current to the element 22. Welding contact elements are also well known and will not be detailed further.

Figure 2:
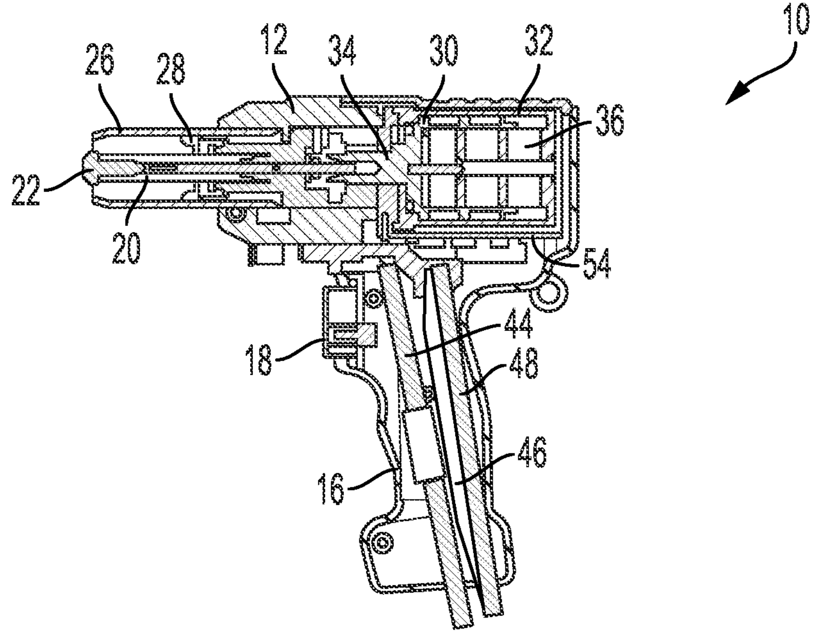
FIG. 2 shows a cross-section view of the handheld welding gun of FIG. 1 with a linear actuator, a control card, a holding unit and a nozzle.

A nozzle (or mouthpiece) 24 surrounds the holding unit 20. The nozzle 24 is adapted to contact the component or workpiece. The nozzle may have a cylindrical shape. The nozzle 24 extends from an extremity of the main portion 14. As seen in FIG. 1 or FIG. 2, the nozzle 24 may be provided with indentations 26 arranged at the end of the nozzle destined to contact the component. The nozzle 24 forms position means serving to position the welding gun 10 (and more particularly the element 22 mounted in the welding gun) at a predetermined distance from the component. The nozzle may also be used as a shield. The nozzle 24 may also comprise holes 28 provided in its cylindrical surface (e.g. at a non-zero distance from the surface adapted to contact the workpiece) to prevent wear and pollution, thus reducing the maintenance needs.

A linear actuator unit 30 is mounted within the main portion 14, as better seen in FIG. 2. The linear actuator unit 30 comprises a linear actuator with a linear actuator housing 32, a linear actuator rod 34 and a motor 36. The motor 36 is for instance a voice coil motor with a coil body and is arranged within the housing 32. The linear actuator rod 34 extends partly inside and outside the housing. The linear actuator rod 34 is movable in translation only and is secured against rotation around the longitudinal axis X. The linear actuator rod 34 is movable along the longitudinal axis X.

Figure 7:
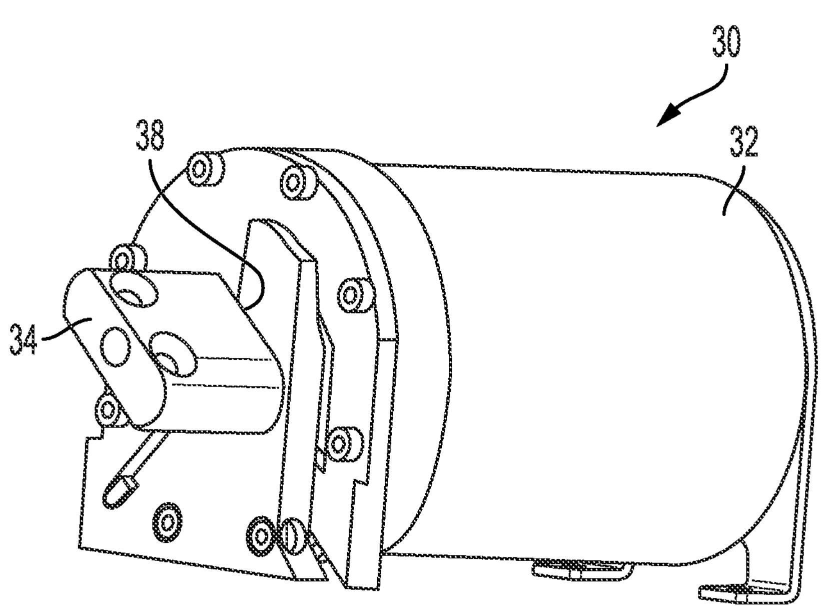
FIG. 7 shows the actuator unit of FIG. 4.
Figure 8:
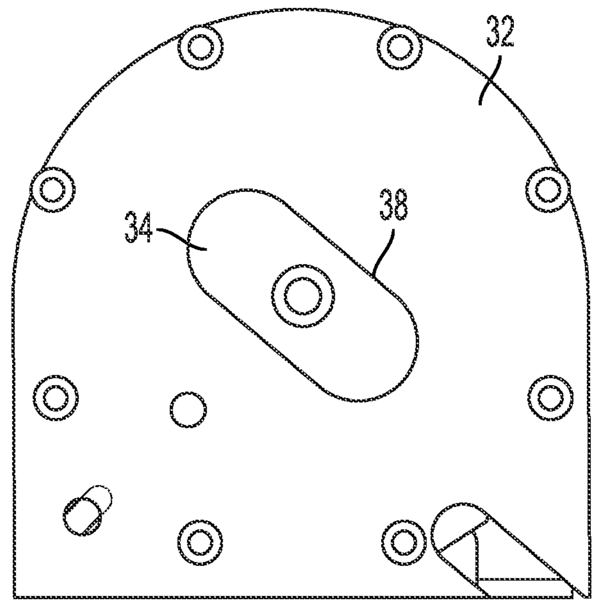
FIG. 8 shows the actuator rod and the actuator housing.

The linear actuator rod 34 is mechanically secured against rotation around the longitudinal axis X, as better seen in FIG. 7 and FIG. 8. As depicted in these figures, the linear actuator rod 34 has a non-circular cross-section and extends outside of the linear actuator housing 32 by an opening 38. The opening 38 has a form-fitting shape which corresponds to the shape of the linear actuator rod's cross section. The linear actuator rod 34 may have an oblong cross-section shape and extends outside from the housing through an opening having a corresponding oblong shape. Other shapes securing the rod against a rotation around the longitudinal axis may be implemented.

Figure 9:
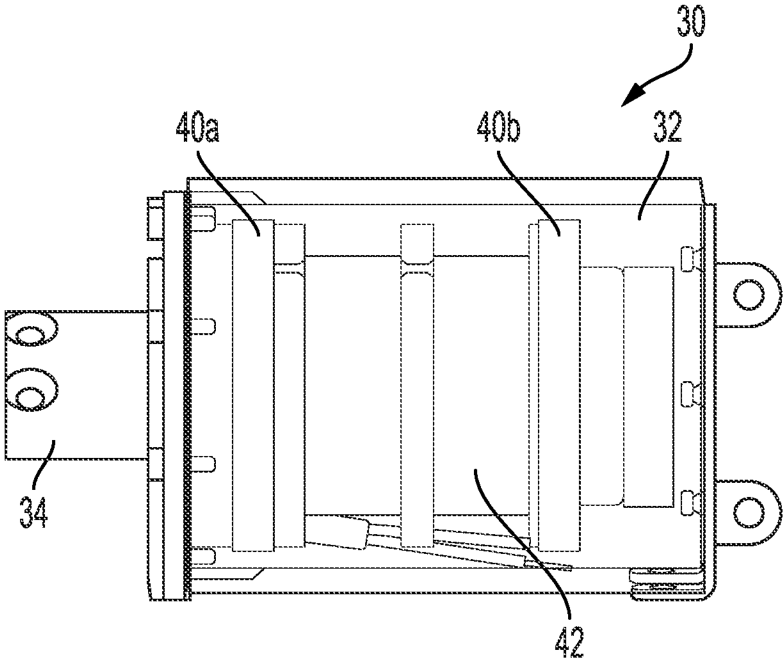
FIG. 9 shows the actuator unit with the bearings.

As seen in FIG. 9, the movable parts of the linear actuator are guided within the linear actuator housing 32 by a bearing 40, for example a sintered bronze bearing. However, in other embodiments, other bearings may be implemented. The coil body 42 of the linear actuator is arranged within the linear actuator housing 34. Two bearings 40 are arranged between the coil body 42 and the linear actuator housing. A first bearing 40*a* is arranged at a first end of the coil body. A second bearing 40 *b* is arranged at a second end, opposite the first end, of the coil body 42. The bearings 40 are in direct contact with the coil body 42. The bearings are glued on the coil body.

The linear actuator (and more particularly the linear actuator rod 34) interacts with the holding unit 20 in order to move an element between the plunge position and the lift position.

As depicted in FIG. 2, a gas tube 44 is provided in the grip 16 to provide gas for the welding process. Welding wires 46 and control wires 48 are also represented.

A sensor unit 50 is arranged within the housing 12 to measure different parameters before and/or during and/or after the welding process. The sensor unit 50 communicates with a processing system 52 comprising a control card 54. The control card 54 is arranged within the housing 12.

Figure 6:
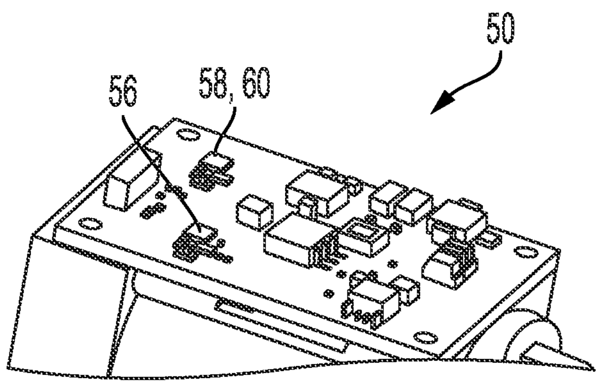
FIG. 6 shows the control card with the gyroscope sensor.

The sensor unit 50 comprises a gyroscope sensor 56. The gyroscope sensor 56 is mounted within the housing 12 and is arranged on the control card 54. The gyroscope sensor 56 allows the monitoring of the welding process. The gyroscope sensor 56 also enable to monitor the correct use of the welding gun and to identify the welding points or positions. Indeed, the gyroscope sensor senses changes twists and angles of the welding gun 10. The gyroscope sensor is adapted to sense the angular velocity of the welding gun and thus the angular position of the welding gun can be detected. The position of the gyroscope sensor on the control card is for instance represented in FIG. 6. For example, the gyroscope sensor is fixed on the control card. More particularly, the gyroscope sensor may be fixed to the side of the control card opposite the side facing the linear actuator housing. In an embodiment, the encoder is fixed on the side of the control card facing the linear actuator housing.

The sensor unit 50 may also comprise an accelerometer 58 and/or a magnetometer 60. The accelerometer measures the linear acceleration, wherein the magnetometer senses magnetic field. More particularly, these sensors measure parameters, which added to the those measured by the gyroscope sensor allow a full and complete monitoring of the welding gun and the welding process. The sensor unit 50 thus may measure and collect data related to the orientation, the behaviour, the environment, the speed and acceleration of the welding gun 10. The gyroscope sensor and/or the accelerometer and/or the magnetometer are MEMS sensors. These sensors are positioned on the control card 54. The processing system is adapted to process these collected data and establish a corresponding or adapted response. The accelerometer and/or the magnetometer may be arranged on the side of the control card opposite the side facing the linear actuator housing.

The accelerometer 58 can be integrated with the gyroscope sensor. The accelerometer 58 is for instance a first accelerometer 58 with a first measurement width. A second accelerometer (not illustrated), separate from the first accelerometer, may be provided. The second accelerometer has a second measurement width. The second measurement width is different than the first measurement width. The second accelerometer may be provided in the vicinity of the first accelerometer and arranged on the control card or may be arranged in a different area of the welding gun. The use of a second accelerometer allows a better monitoring of the welding gun, without using expensive sensors.

The collected data enables for instance to detect an improper use of the welding gun or a fall. Indeed, the acceleration measurement may help to detect a misuse of the welding gun or a fall.

The measured data enables a monitoring of the welding gun movements during the welding process. Normally during a welding process, the welding gun 10 must be retained securely in place. Two particular mistakes often occurs: the welding gun 10 is removed too early from the component, or there is a lateral shift of the welding gun 10 during the welding process. Both lead to a weak welding joint. Such mistakes can be detected through the sensor unit 50 and the user can be alerted and invited to check the corresponding joint.

The welding gun 10 may comprise a display and the orientation of the display may be changed depending on the data of the gyroscope sensor.

Figures 3A, 3B:
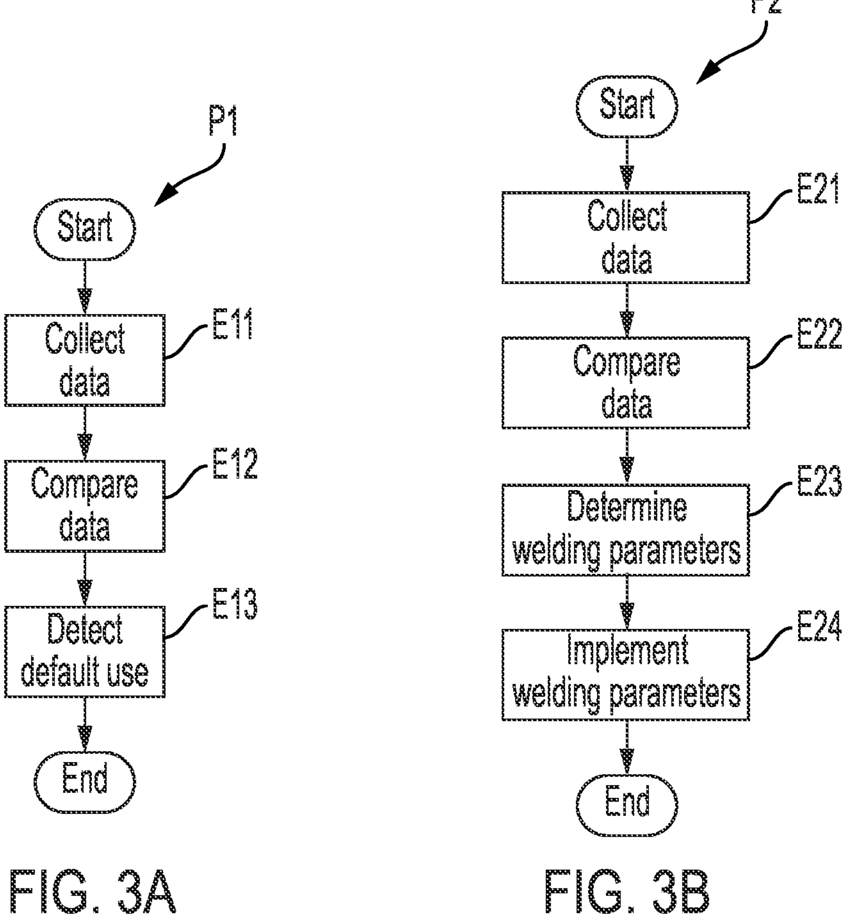
FIG. 3A shows an example of a detection method for detecting an improper use of the welding gun of FIG. 1.
FIG. 3B shows an example of a welding parameter detection method for automatically detecting welding parameters of the welding gun of FIG. 1.

FIG. 3A illustrates a broad method P1 for detecting an improper use of the welding gun using the parameters of the sensor unit. At E11, the method P1 collects data from the gyroscope sensor and/or the accelerometer and/or the magnetometer regarding the motion and the position of the welding gun. At E12 the method P1 compares the collected data to target data or to a library comprising different profiles of use. At E13 the method detects a default use based on caparison analysis. In an embodiment, the improper use can be detected based on statistical analysis.

FIG. 3B shows a method P2 for determining welding parameters which comply with the current welding situation. At E21, the method P2 collects data from the respective sensors (e.g. gyroscope sensor, accelerometer and/or magnetometer). At E22, the method P2 compares the data with pre-recorded data, in order to determine the position and behaviour of the welding gun in its environment. At E23, the method P2 determines the welding parameters (e.g. quantity of gas, energy, time necessary on the lift position, time necessary for the plunge position, . . . ) based on comparison from a library or using a statistical model or both. Once the welding parameters have been determined, they are implemented by the welding gun.

As previously mentioned, the magnetometer detects the movement of the motor. The welding gun first contacts the component. Upon contact, the motor is slightly moved by the nozzle. After the contact, no acceleration and a static magnetic field are recorded. A peak in the magnetic field is recorded when the motor, after initiation of the welding process, is activated. When the welding process is over, no acceleration and no disturbance of the magnetic field are recorded. When the welding gun is removed from the component, a disturbance of the magnetic field and an acceleration peak are recorded.

Three phases of the welding process can be easily identified through the data provided by the sensor unit, on notably lift on (corresponding to the lift position of the holding unit), hold step and lift off (corresponding to the plunge position).

When recording the acceleration and the magnetic field, a delay between the end of the welding process and the removal of the welding gun from the component is visible. Such delay, if too short may be synonym of a removal of the welding gun from the component, which is too early.

A comparison of the data recorded during the welding process with a target state or target situation can be made in order to detect any mistake made by the user during the welding process, as above-mentioned.

The processing system can automatically set up adapted welding parameters from the data provided by the sensing unit. Indeed, the position of the welding gun enables to determine if the welding joint has to be made downward or upward and welding parameters like gas, intensity, stroke, . . . can be adapted to the welding position of the welding gun.

It is known in current welding gun to count the number of elements which have been welded to the component. However, through the data measured by the sensor unit, it is also possible to improve the features of the current welding gun by automatic recognition of the welding program used by the welding gun. For instance, the processing system may detect a particular welding program from a library comprising a plurality of predetermined welding program with the recorded orientation of the welding gun. Besides, an element mistakenly positioned could also be detected. Besides, the sensor unit allows counting the number of weld spots by using the data provided. This counting function enables to ensure that the welding cycle is completed, and no spot has been disregarded. Besides, for each weld spot a particular orientation or position of the welding gun may be necessary. The sensor unit can confirm that the element have been welded at the correct spots with correct pre-determined weld parameters.

Figure 4:
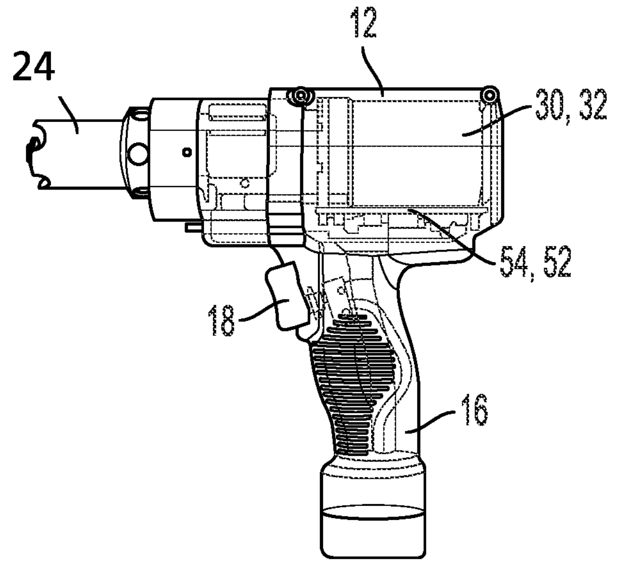
FIG. 4 shows the handheld welding gun with the actuator unit mounted within the housing.

The welding gun comprises a displacement measuring system 62 communicating with the control card. The displacement measuring system is more particularly visible on FIG. 2, FIG. 4 and FIG. 5. Actually, the displacement measuring system 62 is mounted on the control card 54. The linear actuator, the displacement measuring system 62 and the control card 54 are connected together to form a compact actuator unit. The actuator unit is mounted in the main portion at the opposite of the holding unit 20. More particularly, the main portion 14 extends along the longitudinal axis X and is provided at one of its ends with the holding unit 20. The linear actuator unit 30 is mounted within the main portion at the opposite end, as previously described.

Figure 5:
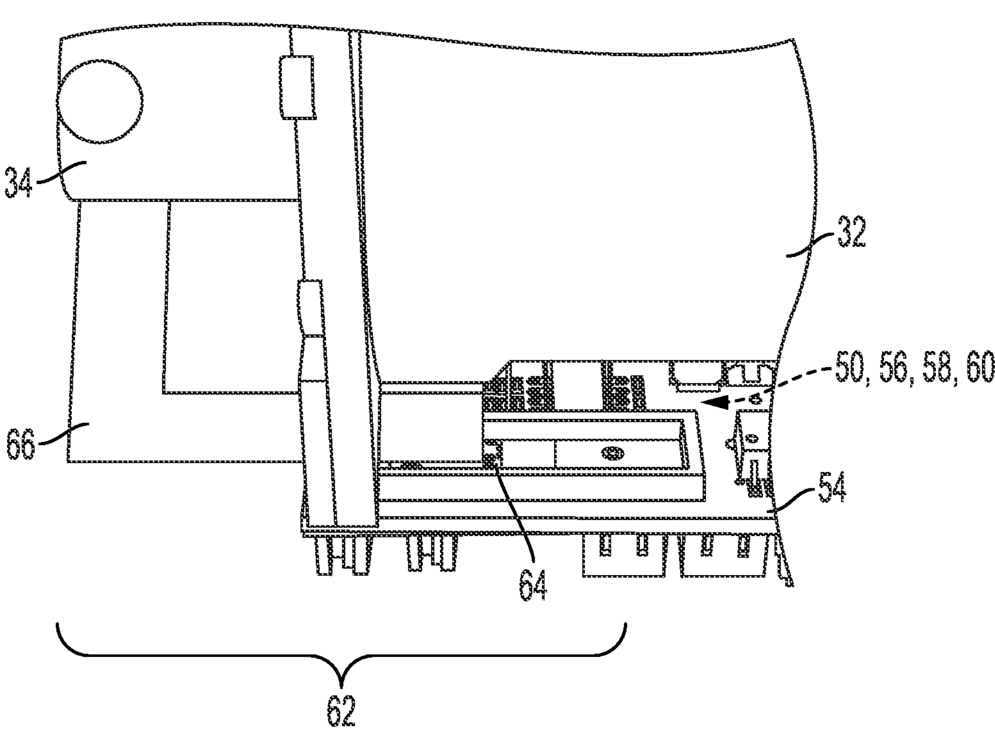
FIG. 5 shows the control card with the displacement measuring system.

The displacement measuring system 62 is for instance an optical measuring system. It comprises an encoder 64 arranged on the control card 54 and an encoder strip 66. The encoder strip 66 is movable (and more particularly slidingly movable along the longitudinal axis X) with regard to the encoder 64. The encoder strip 66 is fixedly connected to the linear actuator rod 34 and moves above the encoder 64, such that the motion of the linear actuator rod 34 can be detected and recorded by the encoder 64. The encoder strip 66 is fixed to the linear actuator rod 34 through a strip holder, as depicted in FIG. 5.

The encoder 64 is fixed on the control card 54 and is encapsulated in order to avoid any dust or smoulder. The encapsulation is for instance realized with a non-oven material which is arranged around the encoder 64.

The control card 54 with the sensor unit 50 and the encoder 20 is fixed to the linear actuator housing 32 at one end of the main portion, such that a compact control command unit is realized, and it can directly be integrated within the welding gun 10 and no additional part are needed. More particularly, the control card is fixed on a side of the linear actuator housing which is facing the grip (in other words on the bottom side of the linear actuator housing). Actually, the control card 54 is screwed on the linear actuator housing. In other embodiments, the control card may be snap fitted to the linear actuator housing or glued to it. As illustrated in FIG. 5, the linear actuator housing 34 is sensibly cylindrical.

The welding gun is thus directly provided with the control command for processing the sensor unit and/or displacement measurement system data, and no additional part to control these data outside of the welding gun, is necessary. An external controller still controls the welding per se.

The welding gun 10 may comprise feeding means by way of which the element 22 can be fed automatically to the holding unit. For example, pneumatic feeding means. The feeding means can feed the element at a posterior end of a tube and then carry them by compressed air as far as an anterior end of the holding means. In another embodiment, the feeding of elements 22 may be manual.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

welding gun 10
housing 12
main portion 14
a grip 16
trigger 18
holding unit 20
element 22
nozzle 24
indentations 26
holes 28
linear actuator unit 30
linear actuator housing 32
a linear actuator rod 34
and a motor 36
opening 38
bearing 40
coil body 42
first bearing **40*a***
second bearing **40*b***
gas tube 44
welding wires 46
control wires 48
sensor unit 50
processing system 52
comprising a control card 54
gyroscope sensor 56
accelerometer 58
and a magnetometer 60
displacement measuring system 62
encoder 64
encoder strip 66

What is claimed is:

1. A handheld welding gun for welding a fastener to a component according to a welding process, the handheld welding gun comprising:
- a housing with a main portion and a grip with a trigger, the grip extending from the main portion;
- a holding unit mounted on the main portion and adapted to hold the fastener;
- a linear actuator adapted to actuate the holding unit in order to move the fastener between a lift position and a plunge position;
- a nozzle surrounding the holding unit and adapted to contact the component;
- a welding current contact element arranged in the housing and adapted to direct a welding current to the fastener;
- a processing system with a control card, wherein the control card is adapted to control the welding process; and
- a sensor unit adapted to measure different parameters during the welding process, the sensor unit including a gyroscope sensor mounted within the housing and arranged on the control card.

2. The handheld welding gun according to claim 1, wherein the sensor unit further includes an accelerometer and a magnetometer mounted within the housing, and wherein the accelerometer and the magnetometer communicate with the processing system and are arranged on the control card.

3. The handheld welding gun according to claim 2, wherein the magnetometer is detecting the magnetic field of the linear actuator, and wherein the magnetometer is arranged on the side of the control card opposite the side facing a linear actuator housing.

4. The handheld welding gun according to claim 2, wherein the gyroscope sensor and/or the accelerometer and/or the magnetometer are MEMS sensors.

5. The handheld welding gun according to claim 2, wherein the gyroscope sensor and/or the accelerometer and/or the magnetometer are mounted in the main portion of the housing.

6. The handheld welding gun according to claim 2, wherein the gyroscope sensor and/or the accelerometer are mounted in the grip of the housing.

7. The handheld welding gun according to claim 2, wherein the motion and/or the position and/or the orientation of the handheld welding gun is detected by the gyroscope sensor and/or the accelerometer and/or the magnetometer, and the processing system is configured to adapt the welding process depending on the position and/or the motion and/or the orientation of the handheld welding gun.

8. The handheld welding gun according claim 1, wherein the main portion and the holding unit longitudinally extend along a longitudinal axis corresponding to a welding axis, wherein the grip extends longitudinally along an axis orthogonal to the longitudinal axis, and wherein the gyroscope sensor continuously senses the orientation of the handheld welding gun.

9. A method for monitoring the behaviour of a handheld welding gun during welding of a fastener to a component according to a welding process, the method comprising:

providing a handheld welding gun including:

a housing with a main portion and a grip with a trigger, the grip extending from the main portion;

a holding unit mounted on the main portion and adapted to hold the fastener;

a linear actuator adapted to actuate the holding unit in order to move the fastener between a lift position and a plunge position;

a nozzle surrounding the holding unit and adapted to contact the component;

a welding current contact element arranged in the housing and adapted to direct a welding current to the fastener;

a processing system with a control card adapted to control the welding process; and a sensor unit adapted to measure different parameters during the welding process, the sensor unit including a gyroscope sensor mounted within the housing;

determining an orientation of the handheld welding gun using the gyroscope sensor; and adapting a parameter of the welding process associated with a period after its initiation based on the orientation of the handheld welding gun.

10. The method according to claim 9, further comprising providing a library including a plurality of predetermined welding programs, comparing the orientation of the handheld welding gun to a plurality of profiles of use corresponding to the plurality of predetermined welding programs; and selecting a particular welding program from the library dependent on the comparison.

11. The method according to claim 9, further comprising comparing the orientation of the handheld welding gun to target data and determining an improper operation based on the comparison.

12. The method according to claim 10, wherein the selecting of a particular welding program further depends on a parameter recorded by the gyroscope sensor.

13. The method according to claim 9, further comprising counting and recording the number of weld spots based on a parameter recorded by the gyroscope sensor.

14. The method according to claim 9, further comprising:

recording the acceleration of the handheld welding gun along a welding axis during the welding process;

recording the strength of the magnetic field along the welding axis; and detecting whether an early removal of the handheld welding gun from the component has occurred based on the recorded acceleration and the recorded strength.

* * * * *